US006482529B2

(12) United States Patent
Sanduja et al.

(10) Patent No.: US 6,482,529 B2
(45) Date of Patent: Nov. 19, 2002

(54) POLYMERIC COATING COMPOSITIONS, POLYMER COATED SUBSTRATES, AND METHODS OF MAKING AND USING THE SAME

(75) Inventors: Mohan L. Sanduja, Flushing, NY (US); Carl Horowitz, Brooklyn, NY (US); Paul Thottathil, New Hyde Park, NY (US); Lina Zilberman, Brooklyn, NY (US); Edward Greenwood, Jackson Heights, NY (US)

(73) Assignee: Alchemetal Corp., Holbrook, NY (US)

( * ) Notice: Subject to any disclaimer, the term of this patent is extended or adjusted under 35 U.S.C. 154(b) by 0 days.

(21) Appl. No.: 09/849,651

(22) Filed: May 4, 2001

(65) Prior Publication Data

US 2002/0040082 A1 Apr. 4, 2002

Related U.S. Application Data

(62) Division of application No. 09/087,536, filed on May 29, 1998, now Pat. No. 6,281,275.

(51) Int. Cl.[7] .................. B32B 27/00; B32B 27/06; B32B 27/08; B32B 27/34; B32B 15/08
(52) U.S. Cl. .................. 428/473.5; 427/58; 427/96; 427/372.2; 427/385.5; 427/388.1; 427/393.5; 428/458; 428/474.4
(58) Field of Search .................. 427/372.2, 385.5, 427/388.1, 393.5, 58, 96; 428/458, 473.5, 474.4

(56) References Cited

U.S. PATENT DOCUMENTS

| 3,376,168 | A | | 4/1968 | Horowitz .................... 136/146 |
|---|---|---|---|---|
| 3,401,049 | A | | 9/1968 | Horowitz .................... 117/47 |
| 3,698,931 | A | | 10/1972 | Horowitz et al. ......... 117/47 R |
| 3,929,800 | A | | 12/1975 | Horowitz ................ 260/290 R |
| 3,940,377 | A | | 2/1976 | Horowitz et al. .......... 260/79.5 |
| 4,105,811 | A | | 8/1978 | Horowitz et al. ........... 427/302 |
| 4,106,955 | A | | 8/1978 | Horowitz et al. ............... 148/6 |
| 4,316,974 | A | * | 2/1982 | Ohmura et al. |
| 4,421,569 | A | | 12/1983 | Dichter et al. ......... 427/6.14 R |
| 4,472,475 | A | | 9/1984 | Decroix ...................... 428/215 |
| 4,496,794 | A | | 1/1985 | Darms et al. ............... 174/68.5 |
| 4,562,119 | A | * | 12/1985 | Darms et al. |
| 4,673,773 | A | | 6/1987 | Nakano et al.. ............. 174/68.5 |
| 4,751,146 | A | * | 6/1988 | Maeda et al. |
| 4,767,674 | A | | 8/1988 | Shirai et al. ................. 428/461 |
| 5,043,226 | A | | 8/1991 | Wiedeman et al. ......... 428/461 |
| 5,087,658 | A | | 2/1992 | Nishizawa et al. ......... 524/538 |
| 5,141,822 | A | | 8/1992 | Matsuo et al. .............. 428/623 |
| 5,207,873 | A | | 5/1993 | Sandjua et al. .......... 162/358.2 |
| 5,232,748 | A | | 8/1993 | Horowitz et al. ........... 427/553 |
| 5,342,659 | A | | 8/1994 | Horowitz et al. ........... 427/553 |
| 5,650,226 | A | | 7/1997 | Lescaut ...................... 428/338 |

OTHER PUBLICATIONS

"Novamet Conductive Nickel Flake Powder Type HCA–1", Novamet Specialty Products Corp.
Application Bulletin Amoco A1–10 Polymer, Amoco Performance Products, Inc. P04997, pp. 1–4.
Trifunctional Methacrylate Ester, SR9011, Monomers Typical & Chemical Properties.
*Polymer News,* vol. II, No. 11/12, pp. 19–26.

* cited by examiner

*Primary Examiner*—Patrick D. Niland
(74) *Attorney, Agent, or Firm*—Kramer Levin Naftalis & Frankel LLP; Barry Evans, Esq.

(57) ABSTRACT

This invention relates to a coated substrate comprising (i) a substrate and (ii) a coating thereupon comprising a polymeric composition formed from (a) twenty-five to ninety-nine parts by weight of a poly(amide-imide) prepolymer; (b) one to twenty-five parts by weight of a trifunctional ester selected from the group consisting of trifunctional methacrylate ester, trifunctional acrylate ester, and mixtures thereof; (c) from 0.5 to fifteen parts by weight of an organo-reactive silane consisting of an amino group containing alkoxysilane having the formula $NH_2(CH_2)_nSi(OC_2H_5)_3$ where n is an integer from one to twenty; and (d) a conductive additive.

15 Claims, No Drawings

POLYMERIC COATING COMPOSITIONS, POLYMER COATED SUBSTRATES, AND METHODS OF MAKING AND USING THE SAME

RELATED APPLICATION

This application is a division of application Ser. No. 09/087,536 filed May 29, 1998, which application is hereby incorporated in its entirety by reference.

BACKGROUND OF THE INVENTION

1. Field of the Invention

The invention relates broadly to polymeric coating compositions suitable for providing a coating which is solderable and/or has high corrosion resistance and to substrates coated with the same. The coated substrates have improved properties, most importantly, resistance to hostile environments such as corrosive liquids and gases. Furthermore, the coated substrates the ability to be soldered without breaching the polymeric coating and/or electroplated. The invention further relates to methods for producing the polymeric coating compositions and polymer coated substrates.

2. Description of the Related Art

Several publications are referenced in this application. These references describe the state of the art to which this invention pertains, and are incorporated herein by reference.

Polymers have been grafted onto metallic substrates to form coatings that protect the substrates from a variety of environmental conditions. Typically organic coatings and paints are applied onto metallic substrates via a physical bond and act to protect the substrate from corrosive gases, solutions of high or low pH, varying relative humidity and varying temperature conditions. Such physically bonded coatings typically do not provide adequate protection against corrosion or other environmental impacts and have a tendency to become dislodged from the surface of the substrate after relatively short periods of time, particularly under stresses imposed by severe environmental conditions, e.g. the presence of acids or bases, corrosive gases such as hydrogen sulphide, sulphur dioxide and carbon dioxide.

Metal substrates have been coated with polymers by graft polymerization processes with results that are superior to those obtained where the metal substrate is coated with organic paints or coatings. Such grafted coatings are both conductive and provide a durable protective layer which is resistent to severe environmental conditions. U.S. Pat. No. 5,043,226 to Wiedeman, et al. describes methods for applying graft polymers to a variety of metal substrates such as steel, aluminum, iron and other metals.

It is important in many applications that the metal coated substrate have not only excellent corrosion and abrasion resistance as well as resistance to adverse environmental conditions, but that the coated metal also have satisfactory conductivity and solderability, so that it can be used in a variety of industrial applications. Heretofore, the art has not provided polymer coated metal substrates having both a tenaciously bound polymer layer which is corrosion resistant and the necessary properties of conductivity and solderability.

OBJECTS OF THE INVENTION

It is an object of the invention to overcome the above-identified deficiencies.

It is a primary object of this invention to provide a polymer coating composition for a substrate wherein the polymer is grafted to the substrate and tenaciously bound thereto.

It is a further object of the invention to provide a polymer-coated substrate which is highly resistant to abrasion and corrosion as well as to a variety of hostile environmental conditions, including humidity, temperature, pH, chemical attack, etc.

It is still a further related object of this invention to provide a polymer-coated substrate in which the polymer-coating is tenaciously bound to the metal substrate and does not admit of bubbling, cracking or other failure which exposes the substrate to environmental conditions, and, which further has satisfactory conductivity and solderability characteristics such that a metallic or non-metallic substrate, for example, can be used in a variety of industrial applications.

It is still a further and related object of this invention to provide a method for producing such polymer-coated substrates.

It is still a further and related object of this invention to provide such a process wherein the polymer-coating can be relatively inexpensively applied to a variety of substrates.

The foregoing and other objects and advantages of the invention will be set forth in or apparent from the following description.

SUMMARY OF THE INVENTION

The invention relates to novel polymeric coating compositions suitable for coating substrate materials. The polymeric composition according to the invention comprises:

(i) from 25 to 99 parts by wt of a poly(amide-imide) prepolymer;

(ii) from 1 to 25 parts by wt of trifunctional ester, preferably a methacrylate ester of the formula:

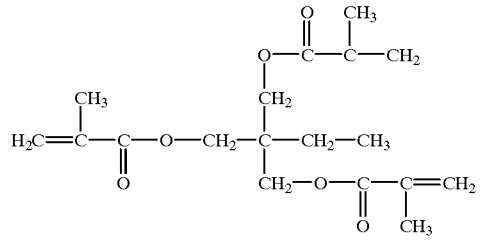

(iii) from 0.5 to 15 parts by wt of a organo-reactive silane monomer, preferably an organo-reactive silane of the formula:

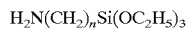

wherein n is an integer from 2 to 20.

According to one preferred embodiment, the coating is a conductive coating comprising conductive additives.

Surprisingly, it has been found that the polymer composition can be applied to a variety of substrates including steel, stainless steel, iron, brass, copper, aluminum, platinum, titanium, silver, gold, Telfon, plastics, glass and others, and that the coated substrate has both excellent resistance to abrasion and corrosion as well as highly desirable properties of conductivity and solderability. Thus, the coated substrates can be used in a variety of products which are exposed to hostile environmental conditions (including high humidity, temperatures, pressures and corrosive gases) while being fabricated into various subcomponents and packaging.

For example, it has now been found that polymer-coated components produced according to the invention can be soldered directly through the polymer coating without breaching that coating and exposing the underlying substrate to environmental conditions. This is a vast improvement over prior art practices which required that the polymer coating be scraped away to expose the substrate to the soldering or welding operation.

The coated substrates in the invention can be efficiently and economically prepared by a graft polymerization procedure which includes the steps of:

(a) forming a prepolymer mixture comprising:
  (i) from 25 to 99 parts by wt of a poly(amide-imide) prepolymer;
  (ii) from 1 to 25 parts by wt of a trifunctional ester; and
  (iii) from 0.5 to 15 parts by wt of an organo-reactive silane;
  (iv) a solvent for said components (i)–(iii); and
  (v) an effective amount of nickel powder;
(b) applying said prepolymer mixture to the surface of said substrate; and
(c) curing said prepolymer mixture.

Accordingly, the invention also relates to a coated substrate comprising a substrate and a polymeric coating thereupon.

DESCRIPTION OF THE PREFERRED EMBODIMENTS

The polymeric coating composition of the present invention is comprised of three different monomeric units, at least one poly(amide-imide) prepolymer, at least one trifunctional ester and at least one organo-reactive silane.

The composition is formed by forming a mixture of monomers containing all three of the aforedescribed components. Broadly, the mixture contains from 25 to 99 parts by wt of the poly (amide-imide) prepolymer, from 1 to 25 parts by wt of the trifunctional ester, and from 0.5 to 15 parts by wt of the organo-reactive silane. Desirably the mixture contains from 70 to 99 parts by wt of the poly (amide-imide) prepolymer, from 5 to 20 parts by wt of trifunctional ester and from 0.5 to 5 parts by wt of the organo-reactive silane monomer. Best results are obtained where the polymeric composition comprises from 85 to 95 parts by wt of the poly (amide-imide) prepolymer, from 5 to 15 parts by wt of the ester and from 1 to 5 parts by wt. of the silane.

The major component of the polymeric composition is a reactive poly (amide-imide). The monomer is fairly low in molecular weight and is readily soluble in organic solvents. The poly (amide-imide) may be, for example, composed of trimellitic, aromatic amide and aromatic imide moieties. AMOCO Al-10 Polymer, available from AMOCO Oil Company, is a suitable component. As supplied, Al-10 Polymer is approximately 50% in the un-imidized or amic acid form. These two-forms of polymer are shown below:

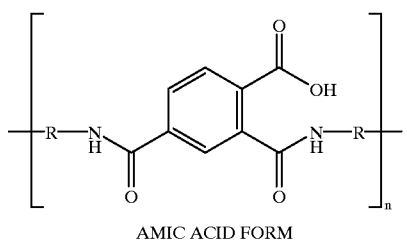

AMIC ACID FORM

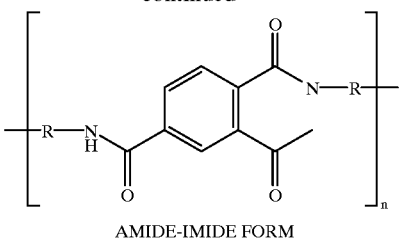

AMIDE-IMIDE FORM

Other suitable polyamides-imides are set forth in U.S. Pat. No. 4,316,974 to Ohmura et al. and U.S. Pat. No. 5,087,658 to Nishizawa et al.

The reactive poly (amide-imide) is soluble in a number of solvents. When polymerized as a homopolymer, the solution of the monomer is heated to achieve drying and cure. During such polymerization steps the solvent is removed, the amic form is cyclisized to the amide-imide form and by chain extension the molecular weight of the polymer increases.

Details of the imidization reaction and the temperature and solvent conditions associated therewith are given in Application Bulletin AMOCO Al-10 Polymer, hereby incorporated by reference.

The second monomer is a trifunctional ester. Suitable trifunctional esters include those known in the art including methacrylate ester, acrylate ester, acid ester and mixtures thereof.

According to one preferred embodiment of the invention, the trifunctional ester is a trifunctional methacrylate ester preferably having the formula:

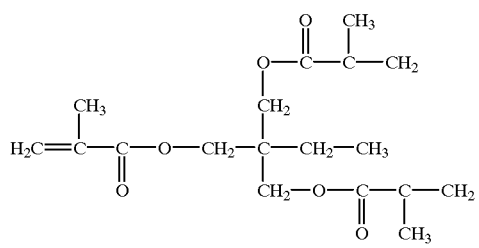

A suitable trifunctional methacrylate ester is SR 9011 available from Sartomer.

The third monomer, used in the smallest amount, is an organo-reactive silane which acts as an adhesion promotor. According to one preferred embodiment, the organo-reactive silane is a silane having the formula:

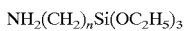

wherein n is an integer from 1 to 20, preferably 2–10.

According to another preferred embodiment, the silane is an aminoalkyltriethoxysilane of the formula:

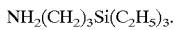

A suitable silane of the above-formula can be obtained under designation A-1100 from OSi Specialties, Inc., 39 Old Ridgebury Road, Danbury, Conn. 06817-0001. The compound sold under that designation is 3-aminopropyltriethoxysilane. Technical details relating to A-1100 may be obtained in Table (i) Dow Corning Brand Organo-Reactive Silanes.

Another aspect of the invention relates to substrates coated with the polymeric composition of the invention. The metal substrates which can be coated according to the invention include steel, iron, aluminum, brass, copper, platinum, titanium, gold, silver and other metals. Plastics can also be coated using the invention. Surprisingly, the coating composition is able to adhere to teflon. The two important criteria of the substrate is (1) that it is wettable by the polymer composition and (2) can withstand the curing temperatures used to cure the coating (as high as 200 to 300° C.). The substrate may be prepared for coating by dipping, applying, spraying, etc.

A further embodiment of the invention relates to a conductive coating comprising the polymeric composition and a conductive additive. Providing a conductive coating allows the coated substrate to be used in a variety of applications. Preferably, the coating compositions comprises at least 40 parts by wt conductive filler, more preferably at least 50 parts by wt, even more preferably at least 60 parts by wt and most preferred at least 70 parts by wt.

According to one embodiment, the coating has sufficient conductivity to allow for soldering and/or electroplating. Surprising, not only can the composition be coated onto materials such as teflon, the resultant coating can also be soldered and/or electroplated.

Preferably, the coating has a surface resistivity less than 5 ohm per square, more preferably less than 2 ohm square, even more preferably less than 1 ohm square and most preferred less than 0.5 ohm per square. If the conductivity of the coating is too low for soldering, the coating can be first electroplated and then soldered.

Thus, one embodiment of the invention relates to a conductive polymeric composition comprising a conductive particulate material. The conductive particulate material may comprise powders, flakes, fibers, platelets, or mixtures thereof and may be any conductive material. Preferably, the conductive material does not oxidize. The conductive particulate material may comprise metals including nickel, copper, silver, gold, platinum, etc.

According to a preferred embodiment of the invention, the conductive particulate material comprises nickel powder. Preferably, the coating composition comprises at least 60 parts by wt nickel powder. According to a still further preferred embodiment of the invention, the conductive additive is a nickel powder which not only provides conductivity, but also acts as a graft initiator. The nickel powder used as a graft initiator is desirably in finely divided form, eg. at least less than −200 mesh, preferably less than −250 mesh and most desirably less than −325 mesh. A suitable nickel powder may be obtained from Novamet under designation Flake HCA-1.

Another aspect of the invention relates to a method of forming the coating composition of the invention. In order to provide a coating composition comprising the above-identified monomers, the components are dispersed in a suitable solvent. A number of different solvents may be used to dissolve the three monomers to form a prepolymer solution. Among these solvents are 1-methyl 2-pyrrolidone, acetone, formamide, dimethyl formamide, dimethyl sulfoxide and dimethyl acetamide.

The mixture of monomers and solvents and conductive filler (for a conductive coating) is prepared as follows. The poly (amide-imide) prepolymer is dissolved in 1-methyl 2-pyrrolidone solvent. The solid prepolymer is milled for a time sufficient to dissolve it in the solution. The mixture is filtered to remove undissolved solids. The solution of prepolymer is added to a second solvent comprising an additional amount of 1-methyl 2-pyrrolidone and Aromatic Solvent 150 (Aromatic Solvent 150 has the chemical name solvent naphtha (petroleum), heavy aromatic and is available from Shell Chemical Company). The ratio of the pyrrolidone to the Aromatic Solvent in the second solvent ranges from from 10/1 to 1/10. The solution of poly (amide-imide) prepolymer is then added to the second solvent and that mixture is stirred until the solution is uniform.

The tri-functional ester (preferably, methacrylate ester), the organo-reactive silane (preferably, aminoalkyl-triethoxysilane) and the conductive filler (preferably, nickel powder) are then added to the solution with stirring to form a uniform composition.

The mixture of monomers, solvent and nickel powder formed as described above is applied to the metal substrate by spraying while continuously stirring the solution. The solution may be sprayed by equipment well known in the art. Broadly, from 1.0 to 4.0 grams of solution applied per square cm of metal substrate to achieve a coating from 0.1 to 2.0 mil thick. Desirably from 2.0 to 3.5 grams of solution are applied to achieve a coating from 0.5 to 1.0 mil thick and most preferably from 2.5 to 3.0 grams per square cm are applied to achieve a coating from 0.5 to 0.6 mil thick.

The coated samples are then cured to form the polymeric coating on the substrate. Broadly the coated samples are held at a temperature of from 100 to 300° C. for from 12 to 15 minutes to permit the solvents to be driven off and the polymerization and grafting of the polymer on the metal substrate to take place. Preferably the coated samples are cured at a temperature from 200 to 280° C. for from 5 to 10 minutes and best results are obtained by curing the coated substrates at a temperature of 240 to 250° C. for from 5 to 7 minutes.

EXAMPLES

The following examples are illustrative of some of the products and methods of making the same falling within the scope of the present invention. They are, of course, not to be considered in any way limitative of the invention. Numerous changes and modification can be made with respect to the invention.

Example I

Following the procedure described above, a solution of poly(amide-imide) prepolymer (AMOCO Al-10) in 1-methyl 2-pyrrolidone was formed. The solution contained 8.10 grams of prepolymer and 24.30 grams of 1-methyl 2-pyrrolidone. This solution was added to 11.66 grams of 1-methyl 2-pyrrolidone and 4.55 grams of aromatic Solvent 150. To that mixture was added 1.00 grams of methacrylate ester SR-9011, 0.20 grams of 3-aminopropyltriethoxysilane (A-1100) and 80.00 grams of nickel powder (Novamet Flake HCA-1).

The mixture so-formed was continuously stirred and sprayed on a 7 square centimeter panel of precleaned steel. 12–14 grams of the mixture was thus coated on the panel. The coated panel was then cured for fifteen minutes at a temperature of 220° C. to effect polymerization of the mixture and grafting thereof to the surface of the panel.

A coated steel is thus obtained. The coating is resistant to corrosive environments and is solderable. The coating had good adhesion (crosshatch, D3359), good abrasion resistance (10 liters sand falling), good impact strength (ASTM D 2794, 100/60 inch pound) and passed 200 hours of the Salt Fog ASTM B 117 test. During soldering, the coating exhibited good adhesion in the flux.

Example II

A coating composition is formed having the following composition:

| Ingredients | Parts by Weight |
| --- | --- |
| Polyimid prepolymer Torlone AI10 25% solution in 1-Methyl 2-Pyrrolidinone | 32.00 |
| 1-Methyl 2-Pyrrolidinone | 12.00 |
| Aromatic Solvent 150 | 4.00 |
| Trimethylol Propane Tri Acrylate SR350 | 1.00 |
| Monomer Silane A187 | 0.20 |
| Nickel Powder Novamet HCA-1 | 75.00 |

The mixture so-formed is continuously stirred and sprayed on a panel of precleaned steel. The coated panel is then cured for fifteen minutes at a temperature of 220° C. to effect polymerization of the mixture and grafting thereof to the surface of the panel.

A coated steel is thus obtained. The coating is resistant to corrosive environments and is solderable.

Example III

A soldering iron of 200 watts 1/2" tip was used for testing solderability of a coated substrate according to the invention.

A coated metal coupon was taken and the desired flux (in the form of a wire—provided by JHR) was melted on the coated surface of the metal with hot soldering iron. The melted flux had good adhesion to the coated surface and was used to join two metals together. A non-coated metallic coupon was not receptive to the adhesion of melted flux. This proves the fact that the coated surface has surprisingly improved solderability.

The above description of the invention is intended to be illustrative and not limiting. Various changes or modifications in the embodiments described may occur to those skilled in the art. These can be made without departing from the spirit or scope of the invention.

What is claimed is:

1. A coated substrate comprising:
   (i) a substrate, and
   (ii) a coating thereupon comprising the polymeric composition comprising:
      (a) from 25 to 99 parts by weight of a poly(amide-imide) prepolymer;
      (b) from 1 to 25 parts by weight of a trifunctional ester selected from the group consisting of trifunctional methacrylate ester, trifunctional acrylate ester, and mixtures thereof;
      (c) from 0.5 to 15 parts by weight of an organo-reactive silane consisting of an amino group containing alkoxysilane having the formula $NH_2(CH_2)_nSi(OC_2H_5)_3$ where n is an integer from 1 to 20; and
      (d) a conductive additive.
2. The coated substrate of claim 1, wherein said substrate is polymeric.
3. The coated substrate of claim 1, wherein said substrate comprises metal.
4. The coated substrate of claim 3, wherein said metal is selected from the group consisting of steel, iron, brass, copper, aluminum, platinum, titanium, silver and gold.
5. The coated substitute of claim 4, wherein said substrate is plastic.
6. The coated substrate of claim 4, wherein said substrate is teflon.
7. The coated substrate of claim 4, wherein said coating further comprises further comprises a conductive particulate material.
8. The coated substrate of claim 1, wherein said conductive particulate material comprises powders, flakes, fibers, platelets, or mixtures thereof.
9. The coated substrate of claim 1, wherein said conductive particulate material comprises metal.
10. The coated substrate of claim 1, wherein said conductive particulate material comprises nickel powder.
11. The coated substrate of claim 1, wherein said coating comprises 60 parts by wt conductive filler.
12. The coated substrate of claim 1, wherein said coating has a surface resistivity less than 2 ohm per square.
13. A coated substrate formed by a method comprising the steps of:
   (a) forming a prepolymer mixture comprising:
      (i) from 25 to 99 parts by wt of a poly(amide-imide) prepolymer;
      (ii) from 1 to 25 parts by wt of a trifunctional ester selected from the group consisting of trifunctional methacrylate ester, trifunctional acrylate ester, and mixtures thereof; and
      (iii) from 0.5 to 15 parts by wt of an organo-reactive silane consisting of an amino group containing alkoxysilane having the formula $NH_2(CH_2)_nSi(OC_2H_5)_3$ where n is an integer from 1 to 20;
      (iv) a solvent for said components (i)–(iii); and
      (v) an effective amount of conductive filler;
   (b) applying said prepolymer mixture to the surface of said substrate; and
   (c) curing said prepolymer mixture.
14. A coated substrate comprising:
   (i) a substrate, and
   (ii) a polymeric composition applied thereupon comprising:
      (a) from 25 to 99 parts by weight of a poly(amide-imide) prepolymer;
      (b) from 1 to 25 parts by weight of a trifunctional ester selcted from the group consisting of trifunctional methacrylate ester, trifunctional acrylate ester, and mixtures thereof; and
      (c) from 0.5 to 15 parts by weight of an organo-reactive silane consisting of an amino group containing alkoxysilane having the formula $NH_2(CH_2)_nSi(OC_2H_5)_3$ wherein n is an integer from 1 to 20.
15. A method for forming the coated substrate of claim 14 comprising the steps of:
   (a) forming a prepolymer mixture comprising:
      (i) from 25 to 99 parts by wt of a poly(amide-imide) prepolymer;
      (ii) from 1 to 25 parts by wt of a trifunctional ester;
      (iii) from 0.5 to 15 parts by wt of an organo-reactive silane; and
      (iv) a solvent for said components (i)–(iii);
   (b) applying said prepolymer mixture to the surface of said substrate; and
   (c) curing said prepolymer mixture.

* * * * *